United States Patent [19]

Tashiro

[11] Patent Number: 4,949,220
[45] Date of Patent: Aug. 14, 1990

[54] HYBRID IC WITH HEAT SINK
[75] Inventor: Tadafumi Tashiro, Tokyo, Japan
[73] Assignee: NEC Corporation, Japan
[21] Appl. No.: 314,503
[22] Filed: Feb. 23, 1989
[30] Foreign Application Priority Data Feb. 24, 1988 [JP] Japan .................................. 63-23962

[51] Int. Cl.⁵ .............................................. H65K 7/20
[52] U.S. Cl. .................................... 361/386; 165/80.1;
165/185; 174/16.3; 357/81; 361/388; 363/144
[58] Field of Search ............................. 165/80.1, 185;
174/16.3, 52.4; 357/81; 361/386–389; 363/141, 144

[56] References Cited
U.S. PATENT DOCUMENTS 4,521,828 6/1985 Fanning .............................. 174/52.4
4,639,759 1/1987 Neidig et al. ....................... 174/52.4

Primary Examiner—Gregory D. Thompson
Attorney, Agent, or Firm—Ostrolenk, Faber, Gerb & Soffen

[57] ABSTRACT

A hybrid IC with a heat sink includes a conductive substrate, a heat sink, an insulating sheet, a plurality of terminals, a power-consuming component, and a resin. The heat sink is separated from the conductive substrate. The insulating sheet is arranged on the conductive substrate. Electric components, wiring conductors, and connecting electrodes are arranged on a surface of the insulating sheet. The terminals are connected to the connecting electrodes on the insulating sheet. The power-consuming component is disposed on the heat sink to be connected to the wiring conductors on the insulating sheet through bonding wires. The resin seals the insulating sheet and a portion of the heat sink on which the power-consuming component is disposed.

8 Claims, 2 Drawing Sheets

HYBRID IC WITH HEAT SINK

BACKGROUND OF THE INVENTION

The present invention relates to a small, high-density hybrid IC with a heat sink and, more particularly, to a resin-sealed hybrid IC with a heat sink.

Recent hybrid ICs mount ICs, transistors, capacitors, resistors, coils, and the like on substrates at high density. FIG. 3 is a plan view of a conventional hybrid IC prior to resin sealing. Referring to FIG. 3, reference numeral 11 denotes a base ribbon; 4, an insulating sheet; 5, wiring conductors; 6, IC chips; 7, a ceramic chip capacitor; and 8, a resistor. Connecting electrodes on the insulating sheet 4 are respectively connected to terminals 3 of the base ribbon through bonding wires 14.

In the above-described hybrid IC, however, most of power-consuming components generating much heat are externally mounted. Hence, it is difficult to decrease the number and size of components of an electronic circuit section of an apparatus.

SUMMARY OF THE INVENTION

It is, therefore, a principal object to provide a hybrid IC in which power-consuming components can be integrated so that the number and size of components of an electronic circuit section of an apparatus can be decreased.

In order to solve the above-described problem, according to the present invention, there is provided a hybrid IC with a heat sink, comprising a conductive substrate, a heat sink separated from the conductive substrate, an insulating sheet arranged on the conductive substrate, electric components, wiring conductors, and connecting electrodes being arranged on a surface of the insulating sheet, a plurality of terminals connected to the connecting electrodes on the insulating sheet, a power-consuming component disposed on the heat sink to be connected to the wiring conductors on the insulating sheet through connecting means, and a resin sealing the insulating sheet and a portion of the heat sink on which the power-consuming component is disposed.

DETAILED DESCRIPTION OF THE PREFERRED EMBODIMENTS

Embodiments of the present invention will be described below.

Figure 1:
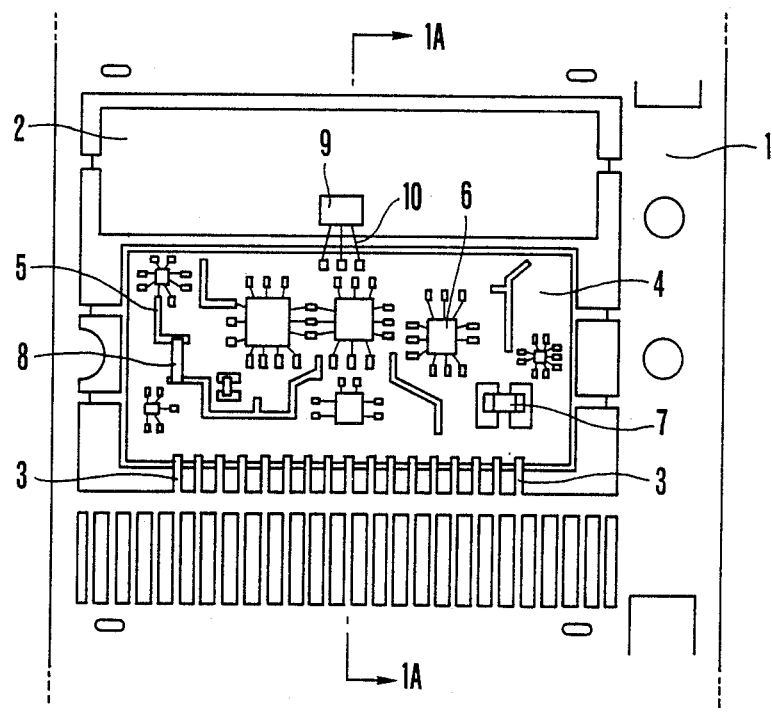
FIG. 1 is a plan view showing an embodiment of the present invention.
Figure 1A:
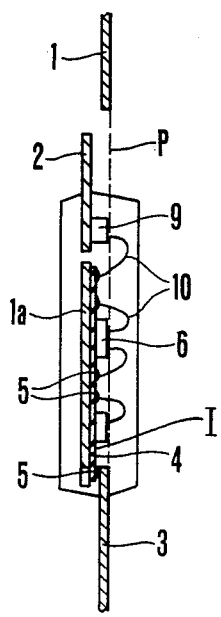
FIG. 1A is a sectional view taken along a line 1A—1A in FIG. 1.

FIGS. 1 and 1A show an embodiment of the present invention. FIG. 1 is a plan view showing the embodiment prior to resin sealing. FIG. 1A is a sectional view, taken along a line 1A—1A in FIG. 1, showing the embodiment upon resin sealing. Referring to FIGS. 1 and 1A, reference numeral 1 denotes a metal base ribbon. An insulating sheet 4 is attached to a base portion (or substrate) 1a ribbon 1. The base portion 1a is a recess formed in the base ribbon by dimpling so as to be lower than a base ribbon surface P (see FIG. 1A) by one level.

Wiring conductors or connecting electrodes 5 are formed on a mounting portion I (see FIG. 1A) of the insulating sheet 4. In addition, IC chips 6, a chip capacitor 7, a resistor 8, and the like are mounted on the mounting section I. In this case, the base ribbon 1 consists of, e.g., a metal material, such as a known iron-nickel-based alloy or bronze. The insulating sheet 4 is constituted by a multilayer wiring structure having wiring layers formed therein as well as on its surface and consisting of, e.g., a polyimide-based insulating material.

Terminals 3 constituting part of the base ribbon 1 are directly connected to the connecting electrodes 5 aligned on the lower side of the mounting portion I of the insulating sheet 4. In this case, notched portions are formed in the lower end portion of the portion 1a of the base ribbon 1 by dimpling at positions corresponding to the terminals 3. Since the rectangular insulating sheet 4 is arranged on the notched portions, and the connecting electrodes 5 are placed under the terminals 3, the above-described connecting operation can be reliably performed. The terminals 3 and the electrodes 5 are directly connected to each other by utilizing a known means, such as soldering. In addition, the base ribbon 1 is also used as a heat sink 2. Similar to the portion 1a, the heat sink 2 is obtained by forming a recess by dimpling. The heat sink 2 is located within the same plane as that of the portion 1a. A power-consuming component 9, such as a power MOS FET or a power transistor, generating much heat is mounted on the heat sink 2. The electrodes of the component 9 are electrically connected to the connecting electrodes 5 on the insulating sheet 4 through bonding wires 10. Therefore, the heat sink 2 and the terminals 3 oppose each other through the base portion 1a. Subsequently, they are resin-sealed (see FIG. 1A) to form a mold package. A large number of terminals 3, heat sinks 2, and portions 1a integrated on the base ribbon are separated from each other, thereby completing a hybrid IC including the power-consuming component 9.

Figure 2:
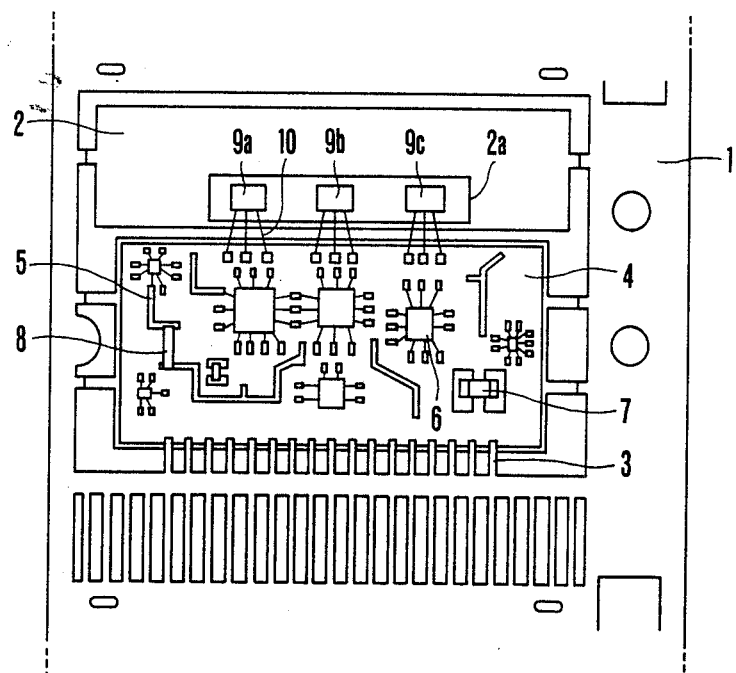
FIG. 2 is a plan view showing another embodiment of the present invention.
Figure 3:
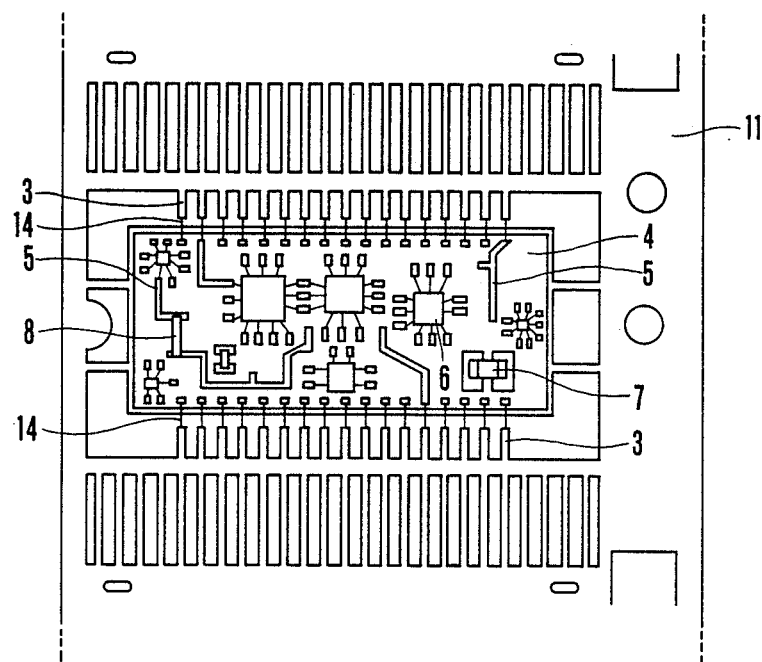
FIG. 3 is a plan view showing a conventional hybrid IC prior to resin sealing.

FIG. 2 shows another embodiment of the present invention. Unlike the embodiment shown in FIG. 1 wherein a single power-consuming component is mounted on the heat sink 2, in this embodiment, three power-consuming components 9a, 9b, and 9c are mounted on a heat sink 2 through an insulating member 2a. However, other arrangements are the same as those in FIG. 1. A plurality of power-consuming components can be mounted on a heat sink in this manner.

As has been described above, according to the present invention, by arranging a heat sink, power-consuming components which cannot be mounted in the conventional techniques can be integrated in a hybrid IC. Therefore, the present invention is effective in decreasing the number and size of components of an electronic circuit section of an apparatus.

What is claimed is:

1. A hybrid IC comprising:
   a conductive substrate;
   a heat sink separated from said conductive substrate;
   an insulating sheet arranged on said conductive substrate, electric components, wiring conductors, and connecting electrodes being arranged on a surface of said insulating sheet;
   a plurality of terminal each terminal being connected to a respective electrode on said insulating sheet;

at least one power-consuming component disposed on said heat sink to be connected to said wiring conductors on said insulating sheet through connecting means; and a resin sealing said insulating sheet and a portion of said heat sink on which said at least one power-consuming component is disposed.

2. An IC according to claim 1, wherein said substrate and said heat sink are formed by dimpling a metal ribbon.

3. An IC according to claim 1, wherein said substrate and said heat sink are formed into a recess lower than a ribbon surface.

4. An IC according to claim 2, wherein said terminals are directly connected to said connecting electrodes.

5. An IC according to claim 1, wherein said at least one power-consuming component comprises a plurality of power-consuming components.

6. An IC according to claim 5, wherein said at least one power-consuming component is arranged on said heat sink through an insulating member.

7. An IC according to claim 1, wherein said heat sink and said terminals are arranged so as to oppose each other through said conductive substrate.

8. An hybrid IC comprising:
a conductive substrate;
a heat sink separated from said conductive substrate;
an insulating sheet arranged on said conductive substrate, electric components, wiring conductors, and connecting electrodes being arranged on a surface of said insulating sheet;
a plurality of terminals arranged to oppose said heat sink through said conductive substrate and connected to said connecting electrodes on said insulating sheet;
at least one power-consuming component disposed on said heat sink to be connected to said wiring conductors on said insulating sheet through connecting means; and
a resin sealing said insulating sheet and a portion of said heat sink on which said at least one power-consuming component is disposed.

* * * * *